(12) United States Patent
Mantog

(10) Patent No.: US 7,181,675 B2
(45) Date of Patent: Feb. 20, 2007

(54) SYSTEM AND METHOD FOR CHECKSUM OFFLOADING

(75) Inventor: Frank Mantog, Elk Grove, CA (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 516 days.

(21) Appl. No.: 10/680,642

(22) Filed: Oct. 6, 2003

(65) Prior Publication Data

US 2005/0076287 A1    Apr. 7, 2005

(51) Int. Cl.
*H03M 13/03*    (2006.01)

(52) U.S. Cl. ...................................... 714/776
(58) Field of Classification Search ................ 714/776
See application file for complete search history.

(56) References Cited

U.S. PATENT DOCUMENTS

| | | | | |
|---|---|---|---|---|
| 5,898,713 A | * | 4/1999 | Melzer et al. ............... | 714/746 |
| 5,943,347 A | * | 8/1999 | Shepard ....................... | 714/747 |
| 6,067,569 A | * | 5/2000 | Khaki et al. ................ | 709/224 |
| 2002/0062333 A1 | * | 5/2002 | Anand et al. ............... | 709/105 |
| 2002/0095642 A1 | * | 7/2002 | Karim et al. ............... | 714/807 |
| 2003/0226018 A1 | * | 12/2003 | Tardo et al. ................ | 713/168 |

OTHER PUBLICATIONS

The American Heritage® Dictionary of the English Language, Fourth Edition; entry for "should"; Copyright @ 2000 by Houghton Mifflin Company; URL: http://www.bartlleby.com/61/83/S0368300.html.*
Merriam-Webster Online Dictionary; entry for "shall" © 2005-2006 Merriam-Webster, Incorporated; URL: http;www.m-w.com/dictionary/should.*

* cited by examiner

*Primary Examiner*—R. Stephen Dildine

(57) ABSTRACT

A communication circuit in a network interface adapter for performing a checksum. One embodiment of the invention includes a network interface adapter having a network interface operable to receive a data packet having a header and a processor coupled to the network interface and operable to perform a checksum operation on each received data packet and operable to change the received data packet in response to the checksum operation. More specifically, the header in each received data packet is changed to a specific pattern of bits to indicate, in an easily recognizable manner, whether the received data packet has passed or failed the checksum.

24 Claims, 4 Drawing Sheets

SYSTEM AND METHOD FOR CHECKSUM OFFLOADING

BACKGROUND

A checksum is an error-detection scheme for inter-computer communications in which a transmitted message between two computers over a network includes by a numerical value within the message that is based on the total number of bits in the message. A component of the receiving computer determines the total number of bits in the received message and compares the determined number to the numerical value in the message to validate that the message is the same as when transmitted. If a discrepancy is detected, the receiving computer flags the message as having a transmission error.

In Transmission Control Protocol/Internet Protocol (TCP/IP)—a communication protocol commonly used by computers that communicate over a network—the checksum scheme is often used to verify that communications are properly transmitted and received.

FIG. 1 is a bock diagram of a conventional TCP/IP packet 100 that is well known in the art. In the TCP/IP packet 100, there are a number of fields that contain data, information about the source and destination of the data, and data about the Packet. One such latter-type field is a checksum field 110, which is typically 16 bits in length and is used by a transmitting computer and a receiving computer to determine the validity the TCP/IP packet 100 as described above.

FIG. 2 is a block diagram of a conventional computer system 200 that uses the checksum scheme to determine the validity of transmitted TCP/IP packets 100. In the system 200, a receiving computer 210 is coupled to a computer network 215. The computer network 215 is typically coupled to one or more computers (not shown) other than the receiving computer 210, one of which is a transmitting computer (also not shown) for this example. The transmitting computer and the receiving computer 210 communicate via the network 215 by transmitting and receiving TCP/IP packets and use a checksum scheme to detect transmission errors and maintain valid communications.

The receiving computer 210 includes a network interface adapter 230 that facilitates communications between the receiving computer 210 and the computer network 215. The network interface adapter 230 includes a Media Access Control (MAC) chip 231 that performs communication facilitation operations as defined by a MAC driver that resides in memory (not shown) of the receiving computer 210. The network interface adapter 230 is coupled to a bus 220 (typically a PCI bus) which is, in turn, coupled to a central processing unit (CPU) 221 and a memory 222. The memory 222 includes a TCP/IP stack 223, which is part of a well-known scheme for handling TCP/IP packets once received from the computer network 215.

As TCP/IP packets are received from the network 215, the MAC chip 231 conventionally manipulates each TCP/IP packet to be suitable for transmission on the bus 220. Then, each TCP/IP packet is stored on the TCP/IP stack to await data retrieval as facilitated by the CPU 221.

During the data-retrieval process from the TCP/IP stack 223, a checksum operation is typically performed on each header portion (TCP and IP header which includes all the fields in a typical TCP/IP packet except the data field) of the TCP/IP packet to ensure that each TCP/IP packet is valid. The checksum operation is executed by the CPU 221 of the receiving computer 210. If a TCP/IP packet is determined to be valid, the pertinent data within the TCP/IP packet is retrieved and directed appropriately. If a TCP/IP packet is determined to be invalid, it is discarded. Thus, invalid TCP/IP packets that do not pass the checksum are a waste of valuable CPU computing power and time.

One solution for alleviating this inefficiency has been to "offload" the TCP/IP checksum operation to the MAC chip 231. Thus, as TCP/IP packets are received, the MAC chip 231 performs the checksum operation on each portion of the TCP/IP packet to determine if the TCP/IP packet is valid or not. If valid, the TCP/IP packet is passed along to the TCP/IP stack 223 via the bus 220, and the CPU 221 retrieves the pertinent data inside the TCP/IP packet and uses the data accordingly. If the TCP/IP packet is not valid, the MAC chip 231 discards it and does not pass it along to the TCP/IP stack 223. In this manner, only valid TCP/IP packets are sent to the TCP/IP stack 223 for data retrieval and the receiving computer 210 does not waste valuable computing power and time by performing the checksum operation on invalid packets.

When the checksum operation is offloaded to the MAC chip 231, the MAC chip is allowed to discard the invalid TCP/IP packets when determined to be invalid as discussed above. For this purpose, the MAC chip 231 must be able to communicate with the CPU 221 in order for the CPU to execute the discarding of the invalid packet. Typically, this communication is handled through an application program interface (API) 232. In smaller systems, however, memory space and connections to and from the CPU 221 are limited and adding an API 232 is problematic. Thus, if the MAC chip 231 cannot discard the invalid TCP/IP packets because an API 232 is not feasible, then the CPU 221 must perform the checksum operation again from the TCP/IP stack 223 and the improvement to efficiency is lost.

SUMMARY

An embodiment of the present invention is directed to an embedded system in a network interface adapter for handling the transmission and receiving of data packets on a computer network. The system includes a network interface operable to receive a data packet having a header and a processor coupled to the network interface and operable to perform a checksum operation on each received data packet and operable to change the received data packet in response to the checksum operation. In one embodiment, the header in each received data packet is changed to a specific pattern of bits to indicate in an easily recognizable manner whether the received data packet has passed or failed the checksum.

This embodiment provides an advantage over the prior art in that computing time and power is saved since the checksum field in each header of each data packet can easily be recognized as having passed or failed. For example, a bit pattern of all zeros may indicate a passed checksum and a bit pattern of all ones may indicate a failed checksum. Thus, instead of wasting valuable computing time and power performing the checksum later in the data-packet receiving process, the checksum function can be offloaded to the network interface adapter and its processor much sooner in the data packet receiving process.

DETAILED DESCRIPTION

Figure 2:
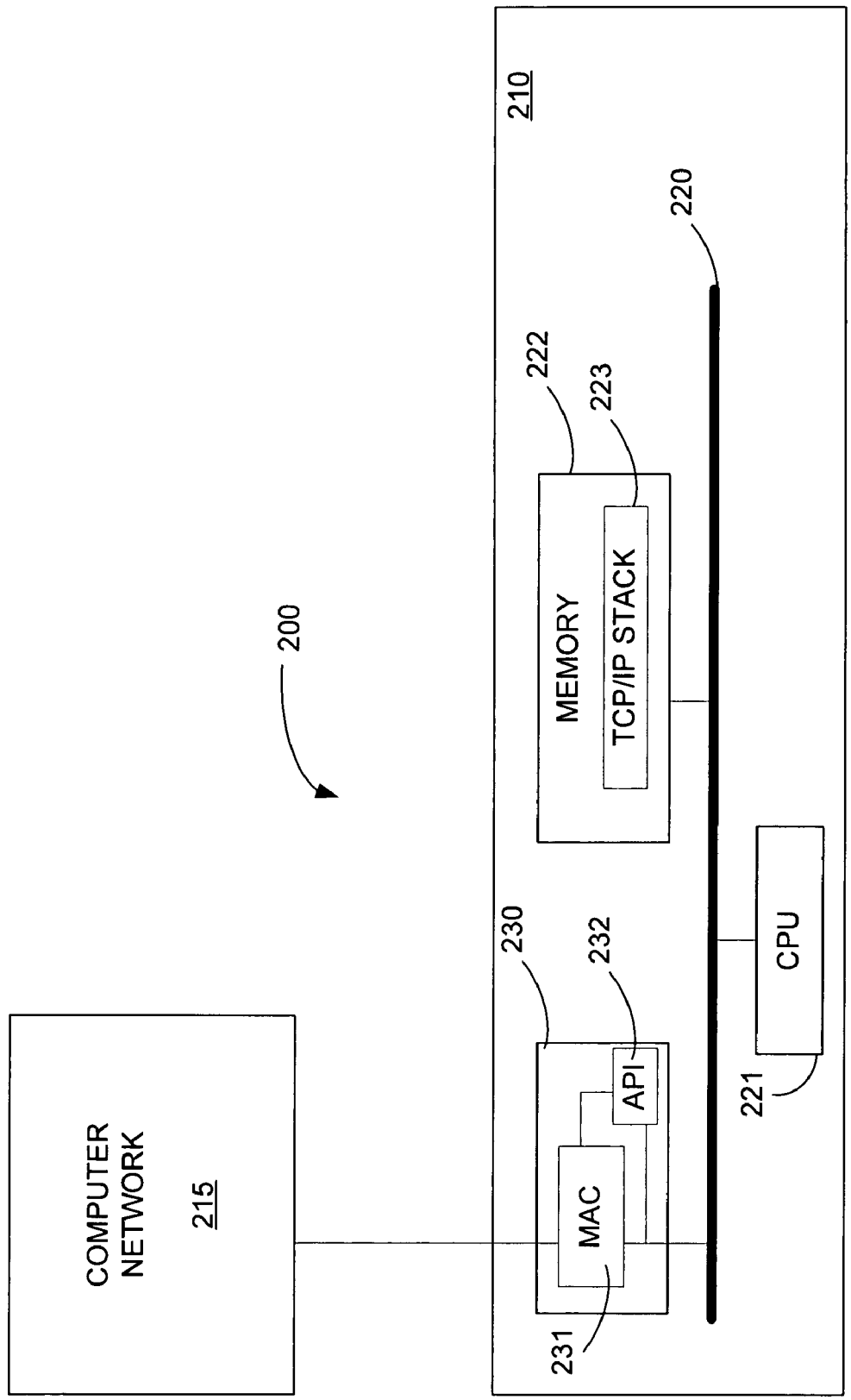
FIG. 2 is a block diagram of a conventional computer system that uses a checksum scheme to determine the validity of transmitted TCP/IP packets.
Figure 3:
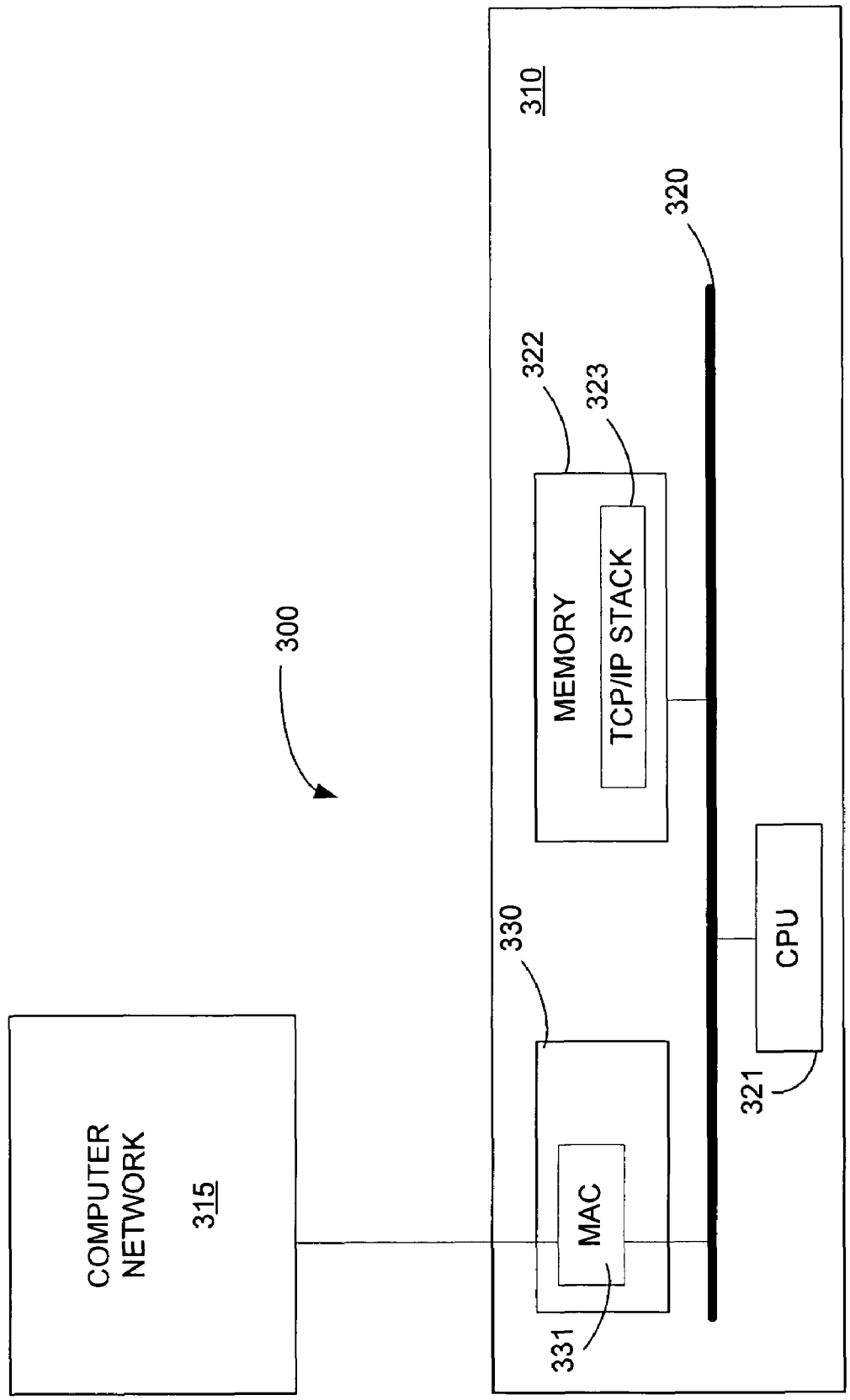
FIG. 3 is a block diagram of a system having a computer that uses a checksum scheme to determine the validity of transmitted TCP/IP packets according to an embodiment of the invention.

FIG. 3 is a block diagram of a system that uses a checksum scheme to determine the validity of transmitted TCP/IP packets according to an embodiment of the invention. Similar to the system 200 shown in FIG. 2, the system 300 also includes a receiving computer 310 coupled to a computer network 315. The computer network 315 is typically coupled to one or more computers (not shown) other than the receiving computer 310, one of which is a transmitting computer (also not shown) for this example. The transmitting computer and the receiving computer 310 communicate by transmitting and receiving TCP/IP packets and use a checksum scheme to maintain valid communications. Other protocols having header information within each packet for communicating between computers on a network, such as UDP/IP, are also possible for use with the present invention, but are not discussed further herein.

The receiving computer 310 includes a network interface adapter 330 that facilitates communications between the receiving computer 310 and the computer network 315. The network interface adapter 330 includes a MAC chip 331 that performs checksum operations as well as other communication facilitation operations. The MAC chip 331 includes a network interface for coupling to the network 315, a processor, and a memory device (individual components not shown for clarity). The network interface adapter 330 is coupled to a bus 320 (typically a PCI bus) which is, in turn, coupled to a CPU 321 and a memory 322. The memory 322 includes a TCP/IP stack 323 for handling TCP/IP packets once received from the computer network 315.

The manner in which the TCP/IP packets are handled at the MAC chip 331 is different from the system of FIG. 2. That is, an API (232 in FIG. 2) is not used for communicating to the CPU 321. Because it is not feasible in small systems to have an API, the MAC chip 331, does not communicate directly with the CPU 321. However, the checksum operation may still be offloaded to the MAC chip 331 and executed in a different manner by the MAC driver program which resides in the memory (not shown) of the MAC chip 331 and is executed by the local processor (also not shown) on the MAC chip 331. The manner of handling packets as determined by the MAC driver is described below.

The MAC driver can perform checksum operations on both incoming (received) packets and outgoing (transmitted) packets. The incoming procedure is described first.

As TCP/IP packets are received by the network interface adapter 330, the MAC chip 231 performs various operations according to the MAC driver including a checksum operation for each portion (TCP and IP) of the TCP/IP packet. As was the case before, certain fields are stripped away from each TCP/IP packet so that the TCP/IP packet is suitable for transmission on the bus 320. The checksum operation is performed on each TCP/IP packet to ensure proper transmission from the transmitting computer. However, if the checksum fails, the MAC chip 331 typically cannot be instructed to discard the failed TCP/IP packet because the CPU 331 cannot communicate the discard command to the MAC chip 331 without an API.

To overcome this problem, yet still take advantage of offloading the checksum operation, the MAC driver of the MAC chip 331 may alter each bit in the checksum field to be a specific bit pattern that indicates either a valid or invalid TCP/IP packet. Then, when the TCP/IP packet is passed to the TCP/IP stack 323, the CPU 321 recognizes one of two bit patterns in the checksum field to quickly determine the validity or invalidity of the TCP/IP packet. This is accomplished faster than performing a second checksum at the TCP/IP stack 323.

Figure 1:
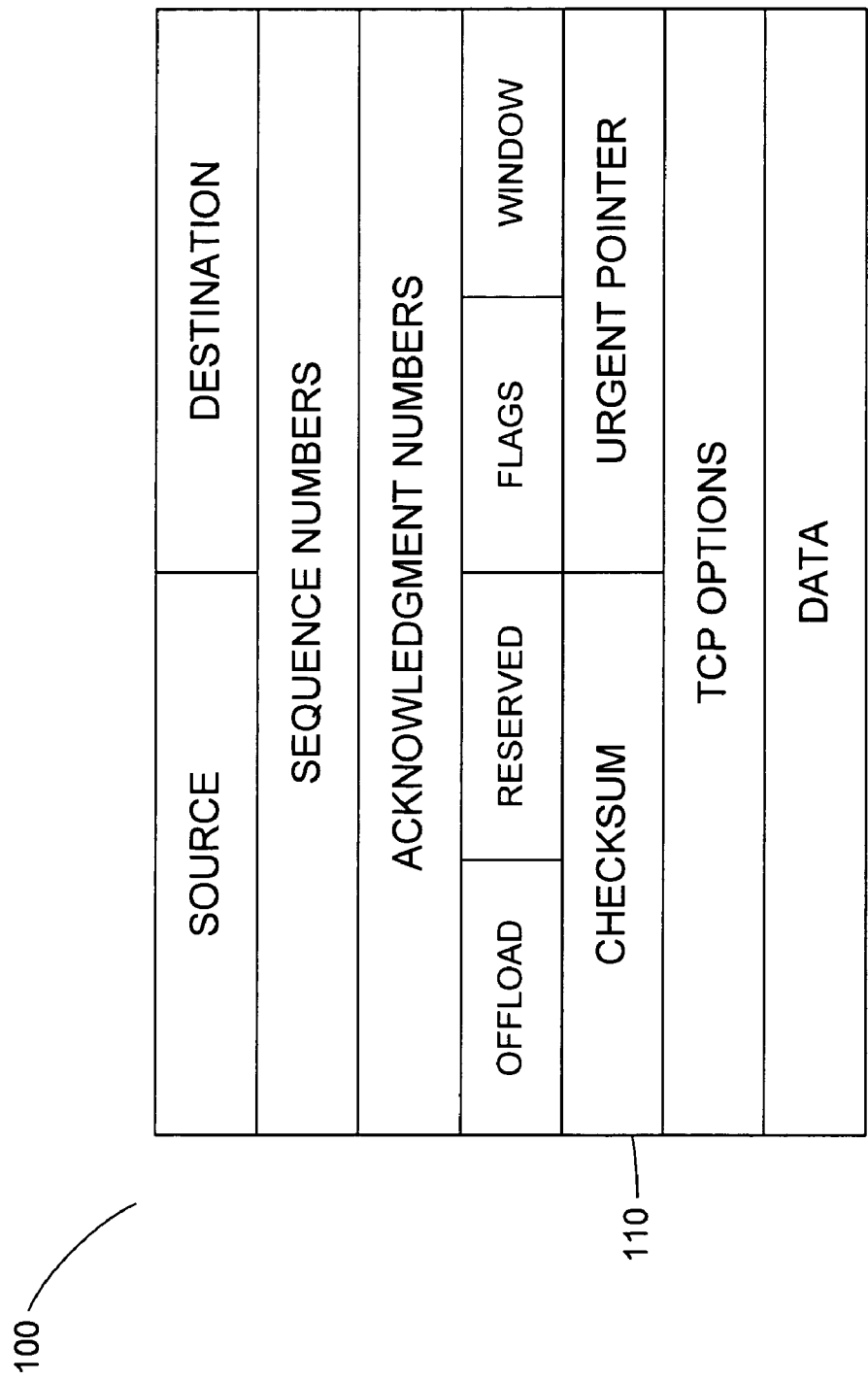
FIG. 1 is a bock diagram of a conventional TCP/IP packet.

For example, if the TCP/IP packet passes the checksum at the MAC chip 331, each bit in the 16-bit checksum field 110 (FIG. 1) of the header is changed to a logical "0" by the MAC driver to indicate that the checksum test has been passed. Conversely, if the TCP/IP packet fails the checksum at the MAC chip 331, each bit in the checksum field is changed to a logical "1" to indicate that the checksum test has failed. Then, as each TCP/IP packet reaches the TCP/IP stack 323, the CPU 321 does not need to perform a checksum, but rather checks for the presence of one of two bit patterns in the checksum field. Checking for one of two bit patterns for each TCP/IP packet requires less computing time and power than performing a second checksum operation for each TCP/IP packet on the TCP/IP stack 323.

If one of the two bit patterns is present in the checksum field, the CPU 321 can either identify the TCP/IP packet as validly received and, thus, pass the TCP/IP packet along to its intended destination within the receiving computer 310, or identify the TCP/IP packet as invalidly received and, thus, discard the TCP/IP packet. If, for whatever reason, the MAC driver of the MAC chip 331 was unable to change the bits in the checksum field, i.e., the bits do not match one of the two patterns, the TCP/IP stack 323 can perform another checksum operation to determine validity or invalidity of the TCP/IP packet as a "catch all" provision. This catch all checksum operation, however, is performed at the expense of time and computing power of the CPU 321.

In a similar manner, the system 300 of FIG. 3 can be used to provide a checksum scheme for outgoing packets as well according to conventional methods. For example, a component (not shown) within the computer 310 may generate data packets for transmission to other computers connected to the network 315. When initially generated, the packets are stored at the TCP/IP stack 323 until transmission to the computer network 315 via the MAC chip 331 as dictated by the CPU 321 controlling the computer 310. In a conventional system, the checksum value would be calculated and added to each data packet at the TCP/IP stack 323 prior to transmission. Again, the calculation and manipulation of the checksum value at the TCP/IP stack 323 is performed at the computing time expense of the CPU 321.

In the system 300 of FIG. 3, however, the checksum operation is not performed at the TCP/IP stack 323, but rather it is performed at the MAC chip 331 by the MAC driver. The MAC driver calculates the checksum and manipulates the bits of the checksum field in each data packet prior to transmission to the computer network 315. By performing the outgoing checksum operation at the MAC chip 331 instead of the TCP/IP stack 323, computer time and power of the CPU 321 saved.

Figure 4:
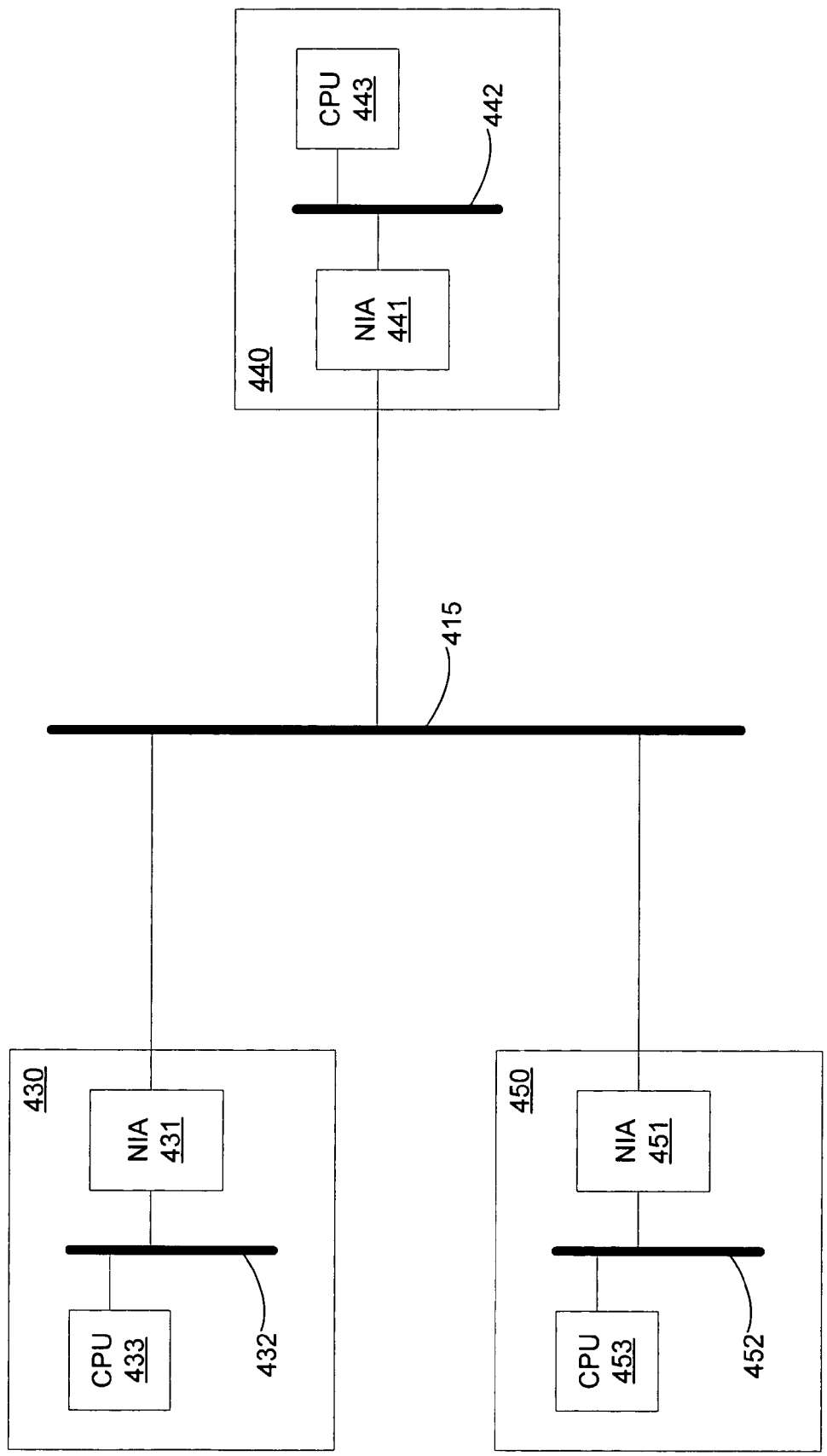
FIG. 4 is a block diagram of networked computers having the system of FIG. 3.

FIG. 4 is a block diagram of a network 400 of computers that incorporates the checksum scheme of FIG. 3 according to an embodiment of the invention. In this network 400, computers 430, 440, and 450, are communicatively coupled by a network connection 415. The network connection 415 is configured to facilitate communication between each computer 430, 440, and 450, using a standard communication protocol, such as TCP/IP. Each computer 430, 440, and 450 includes respective network interface adapters 431, 441, and 451, CPUs 433, 443, and 453, and busses 432, 442, and 452 which operate in conjunction with each other as described above with respect to the computer of FIG. 3. As such, each computer 430, 440, and 450 in this system 400 may be a receiving computer or a transmitting computer during a communication session between any computer 430, 440, and 450 shown here or any other computer (not shown) coupled with the network connection 415. During each communication session, i.e., the sending and receiving of TCP/IP packets between computers 430, 440, and 450, each of the receiving computers perform a checksum at its respective network interface adapter as described above in conjunction with FIG. 3. And each transmitting computer uses a MAC chip (not shown in FIG. 4) to generate a checksum for outgoing packets. In this manner, each computer 430, 440, and 450 in the network 400 saves computing time and power at its respective CPU 433, 443, and 453.

The preceding discussion is presented to enable a person skilled in the art to make and use the invention. The general principles described herein may be applied to embodiments and applications other than those detailed above without departing from the spirit and scope of the present invention. For example, instead of changing the checksum field in the received data packet to reflect a passed or failed checksum operation, the header may be altered in a different manner such as setting a flag indicating a passed/failed checksum. Furthermore, an indicator, separate from the received data packet may be generated and used to indicate a passed or failed checksum. The present invention is not intended to be limited to the embodiments shown, but is to be accorded the widest scope consistent with the principles and features disclosed or suggested herein.

I claim:

1. A communication circuit, comprising:
a network interface operable to receive a data packet having a header; and
a processor coupled to the network interface and operable to perform a checksum operation on the received data packet, and if the checksum operation indicates that the data packet contains an error, to then change the received data packet to include an error indicator.

2. The circuit of claim 1 wherein the data packet comprises a TCP data packet.

3. The circuit of claim 1 wherein the data packet comprises an IP data packet.

4. The circuit of claim 1 wherein the data packet comprises an UDP data packet.

5. A communication circuit, the circuit comprising:
a network interface operable to receive a data packet having a header;
a processor coupled to the network interface and operable to perform a checksum operation on the received data packet and operable to change the received data packet in response to the checksum operation;
wherein the header comprises a checksum field; and
wherein changing the received data packet comprises changing the checksum field.

6. The circuit of claim 5 wherein:
the checksum field comprises a plurality of bits; and
the processor is operable to change each bit in the checksum field to 0 if the received data packet passes the checksum operation.

7. The circuit of claim 5 wherein:
the checksum field comprises a plurality of bits; and
the processor is operable to change each bit in the checksum field to 1 if the received data packet fails the checksum operation.

8. A computer, comprising:
a network interface adapter having:
a media access controller having a network interface and operable to receive a data packet having a header; and
a processor coupled to the network interface and operable to perform a checksum operation on the received data packet and operable to change the received data packet in response to the checksum operation.

9. The computer of claim 8, wherein the processor changes the received data packet in a first manner if the checksum operation is passed and changes the received data packet in a second manner if the checksum operation is failed.

10. The computer of claim 9, further comprising a memory location operable to store the changed data packet.

11. The computer of claim 10, further comprising a central processing unit coupled to the memory location and operable to process the changed data packet if is was changed in the first manner and operable to discard the changed data packet in the second manner.

12. The computer of claim 11 wherein the central processing unit is further operable to perform a second checksum operation if the stored data packet was not changed in either the first or second manner.

13. The computer of claim 10 wherein the memory location is a TCP/IP stack.

14. A method comprising:
generating a checksum from a data packet; and
adding an error indicator to the data packet if the checksum indicates that the data packet has an error.

15. A method comprising:
generating a checksum from a data packet;
changing the data packet in response to the checksum; and
receiving the data packet from a computer network via a network interface adapter having a media access controller.

16. A method comprising:
generating a checksum from a data packet;
changing the data packet in response to the checksum; and
wherein changing the data packet further comprises setting each bit in a checksum field in a header of the data packet to 0 if the data packet fails the checksum operation.

17. A method comprising:
generating a checksum from a data packet; and
changing the data packet in response to the checksum; and
wherein changing the data packet further comprises setting each bit in a checksum field in a header of the data packet to 1 if the data packet passes the checksum operation.

18. A method comprising:
generating a checksum from a data packet;
changing the data packet in response to the checksum; and
storing the changed data packet in a memory location.

19. The method of claim 18, further comprising:
analyzing the changed data packet;
processing the data packet if it was changed in a first manner; and discarding the data packet if it was changed in a second manner.

20. The method of claim 18, further comprising performing a second checksum if the data packet was changed in manner other than a first or second manner.

21. A method, comprising:
generating a checksum from a data packet having a checksum field that includes a checksum value; and
modifying the checksum field in response to the checksum such that the checksum field no longer includes a checksum value.

22. A communication circuit, comprising:
a network interface operable to receive a data packet having a header; and a processor coupled to the network interface and operable
to perform a checksum operation on the received data packet, and
if the checksum operation indicates that the data packet contains no error,
to then modify the received data packet.

23. A method comprising:
generating a checksum from a data packet; and
modifying the data packet if the checksum indicates that the data packet has no errors.

24. The method of claim 23 wherein modifying the data packet comprises modifying a checksum field of the data packet.

* * * * *